United States Patent [19]

Geissberger et al.

[11] Patent Number: 4,918,493
[45] Date of Patent: Apr. 17, 1990

[54] SAGFET WITH BUFFER LAYERS

[75] Inventors: Arthur E. Geissberger; Robert A. Sadler; Gregory E. Menk; Matthew L. Balzan, all of Roanoke, Va.

[73] Assignee: ITT Corporation, New York, N.Y.

[21] Appl. No.: 230,625

[22] Filed: Aug. 10, 1988

[51] Int. Cl.$^4$ .............................................. H01L 27/12
[52] U.S. Cl. .......................................... 357/4; 357/16; 357/60
[58] Field of Search ...................... 357/45 L, 4, 16, 60

[56] References Cited

U.S. PATENT DOCUMENTS 4,088,515  5/1978  Blakeslee ........................ 357/45 L
4,607,272  8/1986  Osbourn ........................... 357/45 L

OTHER PUBLICATIONS

Delalande, Appl. Phys. Lett. (51)(17), Oct. 26, 1987.

Primary Examiner—Martin H. Edlow
Attorney, Agent, or Firm—Thomas N. Twomey; Mary C. Werner

[57] ABSTRACT

A composite buffer layer is formed with a layer of GaAs on a semi-insulating GaAs substrate. Next a short period superlattice is formed followed by another GaAs layer. A layer of GaAlAs is then provided such that the Ai content and no doping followed by an intrinsic GaAs layer. The intrinsic GaAs layer is the active layer which serves as a channel.

7 Claims, 2 Drawing Sheets

SAGFET WITH BUFFER LAYERS

FIELD OF THE INVENTION

The present invention relates generally to the field of GaAs processing for the manufacture of semiconductor products. More specifically, the invention relates to the manufacture of high quality field effect transistors and associated circuitry in monolithic integrated circuit form. According to the invention, an epitaxial buffer structure of intrinsic material is built up commencing with a substrate of GaAs, including one or more intermediate layers and ending with a GaAs layer.

BACKGROUND AND SUMMARY OF THE INVENTION

Semiconductor devices of GaAs have generally been manufactured on substrates of GaAs. The typical process employs the use of vapor phase epitaxy of an active layer having a submicron thickness on a semi-insulating crystalline GaAs substrate. However, due to the frequently encountered crystallographic defects in GaAs substrates, such as lattice defects and dislocations, manufacturers continue to encounter extensions of these defects up through the active layer. These defects cause problems in obtaining uniform electrical properties in the products produced from different locations even on the same wafer. Some of the variations are such as to render the products unacceptable. In an effort to overcome these problems associated with crystal defects in the semi-insulating substrates, buffer layers have been employed between the substrate and the active layer.

Various processes have been employed to provide improved buffer layers. For example, U.S. Pat. No. 4,411,729 describes a process employed prior to the '729 invention as well as the improved process disclosed in the '729 patent. Reference may be made to this patent for details related to the manufacture of epitaxial layers. A GaAs buffer layer is described on a GaAs substrate. U.S. Pat. No. 4,511,813 discloses the use of such a buffer layer in order to obtain a low noise figure in a MESFET.

U.S. Pat. No. 4,602,965 describes the advantages and disadvantages associated with the use of buffer layers in the fabrication of FETs in GaAs. The advantages include reducing the influence of substrate defects on the active layer, while the disadvantages include complexity in the manufacturing process and elevated uncertainty as to the quality of the material in which the ion implantation occurs. Also disadvantageous is the lower resistivity of the buffer relative to the semi-insulating substrate resulting in potential isolation problems which may occur between devices on the same epitaxial layer when planar fabrication is used. Finally, it is pointed out that the substrate continues to exert some influence on the quality of the active layer.

Another application for buffer layers has the primary purpose of providing for the creation of an active layer of one material over a substrate of a different material which has a substantially different lattice constant. U.S. Pat. No. 4,551,394 provides a description of the use of a buffer layer for this application. Commencing with a silicon substrate, a germanium buffer is employed to provide a better lattice match for GaAs than is provided by silicon.

Notwithstanding the prior approaches attempted for providing a high quality transition from a substrate to an active layer where the quality of the crystalline structure is critical to good device performance to specification, there exists room for improvement. One problem associated with prior approaches was that described in U.S. Pat. No. 4,602,965. The buffer layer itself results in isolation problems. According to the present invention, an improved buffer layer structure is provided which is particularly suitable for FET manufacture according to a planar process.

It is an object of the present invention to provide GaAs based electronic devices having better and more consistent electrical performance than was previously obtainable.

It is another object of the present invention to overcome the detrimental effects on GaAs electronic devices previously caused by crystalline defects in semiconductor substrates.

It is still another object of the present invention to provide a method of manufacturing GaAs based electronic devices which manufacturing process has improved immunity to device parameter variations associated with impurities originating in the substrate.

It is yet another object of the present invention to provide these advantages in a planar process suitable for the manufacture of digital FETs.

It is also an object of the present invention to provide a defect-free active layer for the manufacture of GaAs based semiconductor products.

It is still another object of the present invention to provide a planar manufacturing process improvement making it feasible to produce both analog and digital GaAs devices on a common substrate in a single manufacturing sequence.

These and other objects of the invention are met by the invention described herein in its various implementations as well as the obvious modifications thereof which will appear to those skilled in the GaAs processing field.

A planar process which is particularly benefited by the present invention is described in commonly owned U.S. patent application Ser. No. 137,309 entitled "Self-Aligned Gate FET and Process" which was filed Dec. 23, 1987. This process results in fabrication of FETs which rely on the channel current to flow through the active layer without thinning of the active layer at the channel. This is known as a planar process due to the planar surface of the active layer on which the gate and source/drain contacts are provided. As a result, it is especially important to insure that pinch off can be accomplished reliably through the full thickness of the channel. Since the channel is the thickness of the active layer, pinch off must be through the full thickness of the active layer. If channel current is not suitably limited to the active layer, but instead is able to flow through an underlying layer, the gate voltage necessary to terminate FET conduction will be excessive and gate control over $I_{DS}$ will be degraded.

The composite buffer layer employed according to the invention commences with a layer of GaAs on a semi-insulating GaAs substrate. Next, a short period superlattice is formed followed by another GaAs layer. A layer of AlGaAs is then provided such that the Al content of the layer is graded. On this layer is an AlGaAs layer having an optimized Al content and no doping followed by an intrinsic GaAs layer. The intrinsic GaAs layer is the active layer which serves as the channel once it is doped for proper channel operation. The AlGaAs layer immediately beneath the GaAs channel layer provides confinement of the charge to the top GaAs layer. The mole fraction of Al in the AlGaAs layer is selected to provide optimum conduction band offset between the AlGaAs confinement layer and the channel of the FET. This structure provides substantially improved immunity to the active layer with respect to lattice defects and impurities in the substrate.

DETAILED DESCRIPTION OF THE INVENTION

Figure 1:
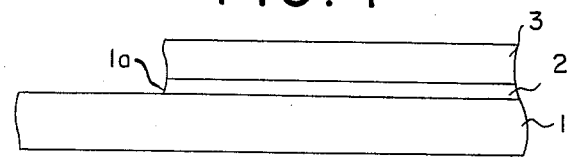
FIG. 1 illustrates a buffer layer provided between a substrate and an epitaxially formed active semiconductor layer.

Referring to FIG. 1, a substrate 1 of a material unsuitable for semiconductor device fabrication has a top surface 1a which is either too rough for device production or is not of sufficiently high crystalline uniformity to provide quality semiconductor devices. A buffer layer 2 is provided over the substrate to provide a transition from the poor quality substrate to a relatively high quality single crystal semiconductor layer 3 which is provided over the buffer layer. In prior attempts to provide a satisfactory transition from GaAs substrates to a quality active GaAs layer, consistent problems have been encountered both with respect to crystal defects being brought through the buffer to the active layer and with respect to contaminants in the substrate migrating through the buffer into the active layer. Both of these occurrences result in degraded operation of semiconductor products formed on such wafers and more importantly, high rates of product rejects (unsatisfactory yields). Applicants have invented a novel solution to these problems, such solution residing in a process for manufacturing the buffer structure of the invention.

Figure 2:
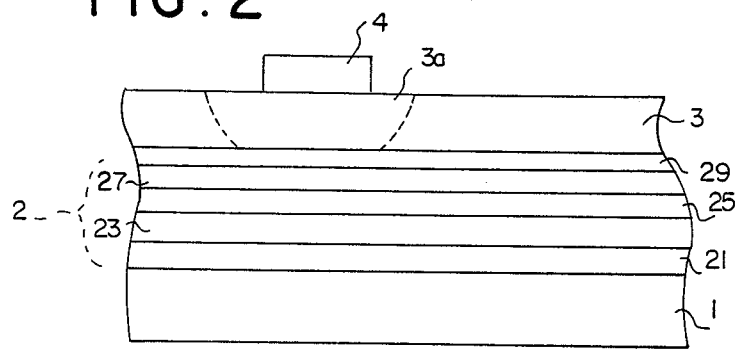
FIG. 2 illustrates a composite buffer layer structured in accordance with one embodiment of the invention.
Figure 3:
FIG. 3 illustrates, in an exploded view, a superlattice which may be employed in the practice of the invention.
Figure 4A:
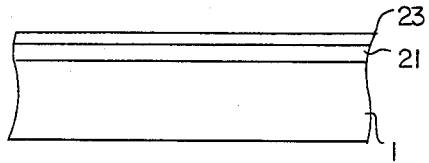
FIG. 4a–4e illustrates the sequential stages of manufacture of a buffer layer made in accordance with a preferred manner of practicing the invention.
Figure 4B:
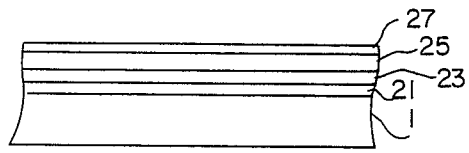
Figure 4C:
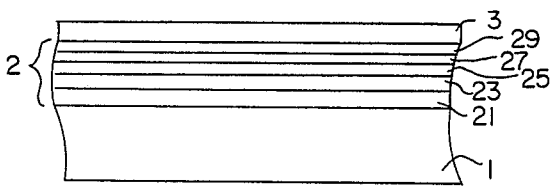
Figure 4D:
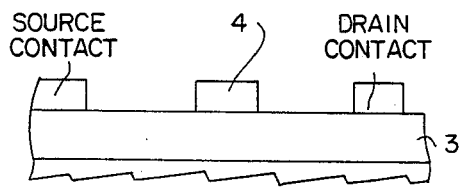
Figure 4E:
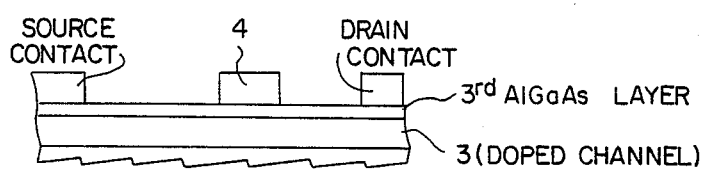

The novel buffer structure shown in FIG. 2 has been found suitable for use even when the substrate is imperfect. The substrate 1 of GaAs may contain undesirable impurities in spite of the best attempts to avoid introduction of such impurities into the substrate. Examples of impurities which have been detected in GaAs substrates include Fe, Cr and EL2 (defects in the Ga and As locations within the lattice structure). In addition to these elemental impurities, substrates which are sold as "single crystal" substrates generally contain crystalline defects such as those in the form of microcracks, lattice dislocations, and lattice vacancies. These crystal impurities and defects may be propagated through a typical buffer layer but are effectively rendered innocuous by the buffer layer of the present invention. In the practice of the invention, a semi-insulating GaAs substrate having a first major surface on a plane oriented up to about 20 degrees towards the (1, 1, 1) a plane from the (1, 0, 0) crystalline plane may be employed. It has been found desirable to employ a GaAs substrate where the first major surface is on a plane oriented up to about 10 degrees towards the (1, 1, 1) A plane from the (1, 0, 0) plane although a plane which is generally aligned with the (1, 0, 0) plane will be operative.

Buffer layer 2 shown in FIG. 2 includes a first epitaxial layer 21 of GaAs formed directly on the top surface 1a of the substrate (layer 1). This first epitaxial layer is not doped and thus is extremely pure GaAs without extraneous impurities in its crystalline structure. However, as with earlier attempts to provide quality buffer layers, this layer alone would not be a high quality buffer since it would be subject to impurity migration and crystalline defect propagation from the substrate. Directly on epitaxial layer 21 is a superlattice 23 including alternating layers of AlAs and GaAs. This superlattice is of intrinsic semiconductor material and is provided as an impurity getter for any impurities migrating from the substrate through the epi-layer 21. It has been determined that gettering occurs with as few as one period of the superlattice, but it is preferred that about 10 periods be provided for commercial quality production due to the smoothing which occurs after 3–5 periods and improves with more periods. Since 10 periods may be formed within about 10 minutes, this is an optimum number of periods. In the preferred implementation, the superlattice is about 50 nanometers thick and consists of 10 periods. This superlattice is referred to herein as a short period superlattice due to the extremely thin nature of each of its constituent layers.

Following provision of the short period superlattice (SPS) 23, a second epitaxial layer 25 of intrinsic GaAs is provided. While the first GaAs layer 21 has a thickness of about 0.1 micrometer, it has been found preferable to fabricate the second layer with a thickness of about 0.2 micrometer. Directly on the second GaAs layer 25 is provided a compositionally graded layer 27 of AlGaAs. This layer is formed by molecular beam epitaxy to commence epitaxial growth of the layer with an Al mole fraction of about 0.1 which mole fraction is monotonically increased to between about 0.04 and 0.6, and preferably to 0.47 over the 100 nanometer thickness of layer 27. Directly on layer 27 is provided an intrinsic epitaxial layer 29 of AlGaAs having a uniform 0.47 mole fraction Al. This layer 29 is about 1 micrometer thick.

According to a preferred manner of practicing the invention, a gradual transition from the AlGaAs growth conditions to the GaAs growth conditions is provided. This improves the surface characteristics of the GaAs layer 3. Smoothing is obtained by allowing the AlGaAs top surface to cool about 50° C. from its forming temperature before commencing growth of GaAs layer 3. AlGaAs growth is best performed at about 670°–680° C. while GaAs growth is best performed at about 630° C. Pressure during growth is about $5 \times 10^{-6}$ TORR. Layer 3 of epitaxial GaAs is formed to a thickness of about 3500 Angstroms. Layer 3 is of intrinsic GaAs and is formed directly on layer 29. It has been found that this buffer structure will provide layer 3 with significantly better freedom from crystalline defects and substrate originated impurities than has been previously obtainable.

Layer 3 is the active layer which is provided with channel doping in the fabrication of GaAs devices in a process such as that described in the above described U.S. application Ser. No. 137,309.

Following completion of the semiconductor devices, including field effect transistors, operation of the devices can be examined to demonstrate the advantages obtainable through the use of the invention. At the interface of the gate 41 with GaAs layer 3, under conditions where the gate is biased to about −1 to −6 volts relative to the drain, there is a depletion region formed in the GaAs layer which extends entirely through the channel region to totally pinch off the channel current. In normal operation, the gate would be biased slightly less than this in order to permit variations in gate potential to alter the channel current. By operating near pinch off, it is possible to obtain lowest noise operation. It is at this point on the bias curve where small carrier leakage from the active layer 3 into the substrate will be most readily detected in the form of noise, thus degrading signal integrity. However, even when the FET is biased to operate well into the linear range, the current flowing in the substrate is a source of noise in the signals being generated. Thus, there is a desire to eliminate this source of signal degradation from the circuit.

According to the present invention, the interface of the AlGaAs layer 29 with the channel layer 3 results in a thin barrier region in the channel layer. This barrier prevents the passage of carriers into the substrate. The barrier region is formed due to the higher bandgap of the AlGaAs material relative to the GaAs layer 3. The amount of conduction band offset between the channel layer 3 and the confinement layer 29 can be altered by varying the amount of Al included in layer 29. Maximum offset is obtained when the mole fraction of Al is approximately 47%. The conduction band offset results in the creation of a barrier region at the heterojunction. Since carrier injection from the GaAs layer into the AlGaAs buffer is greatly reduced by the barrier, and the AlGaAs has a greatly reduced saturation velocity as compared to GaAs, there is little to no parasitic conduction through the substrate. This eliminates substrate conduction in parallel with the channel thus eliminating short channel effects and the induced noise associated with carrier movement in the substrate. The thickness of the AlGaAs layer is between about 0.5 micrometer and 1.0 micrometer. It is desired to provide this layer as thin as possible. It has been found that the low limit of 0.5 micrometer is acceptable and thinner layers may result in formation of a two dimensional electron gas in the underlying GaAs layer. Additionally, provision of AlGaAs layers less than 0.5 micrometer are subject to excessive implant straggle.

In the fabrication of the structure of the invention, it is preferred that molecular beam epitaxy be employed for the formation of the layers 21, 23, 25, 27, 29 and 3. These layers are formed without introduction of dopants and thus have extremely low impurity concentrations, typically less than $5 \times 10^{14}$. It is preferred that the impurity concentrations be maintained at less than $1 \times 10^{13}$. This is about as well as can be obtained through the use of molecular beam epitaxy unless exceptional care is taken to eliminate sources of impurities. Among these exceptional precautions are the selection of ultra pure working materials, maintaining an ultra-high vacuum in the MBE chamber between process steps($1 \times 10^{-10}$ TORR) or better and avoiding human contact with the workpieces.

Metalo-organic chemical vapor deposition (MOCVD), intrinsic layers of AlGaAs and GaAs may be fabricated and subsequently doped by ion implantation. This provides significantly reduced processing complexity and hence, reduced manufacturing costs without substantial deterioration of product quality. The implantation of silicon through the AlGaAs and into the GaAs may be accomplished while maintaining semi-insulating properties in the AlGaAs layer. This is the result of poor activation efficiency of the AlGaAs, thus keeping the effective doping low in the AlGaAs. The structure formed in this manner is similar to the structure formed through the use of MBE.

In the practice of the invention, it is possible to provide a variation of the process which is employed for the provision of the semiconductor devices over the buffer layer. One particular innovation is particularly suited for use in conjunction with the buffer layer described herein. The structure includes a third layer of AlGaAs having an Al mole fraction about the same as that of the second AlGaAs layer. In the preferred practice of the invention, this provides about 47% mole fraction of Al in the AlGaAs. Additionally, the channel is doped with silicon to between about $1 \times 10^{17}$ to $2 \times 10^{18}$. The structure formed in this manner provides buffer layers both below and above the channel to confine the channel carriers to an effectively thinned channel. Additional advantages provided by this arrangement include elimination of short channel effects due to the bottom AlGaAs layer, and decoupling from the field around the gate of charge accumulation at the encapsulant-to-channel interface. This has been a problem in products where exposure to radiated particles has resulted in faulty device operation. Exposure to such radiation may occur either in space or near sources of intense particle radiation.

While the present invention has been described with respect to various specific implementations of the invention, it is to be understood that the invention resides in the novel design approach rather than in the specific implementation described in this application. It is intended that the patent shall cover not only those implementations specifically disclosed, but also all obvious modifications and extensions thereof as well as the entire range of implementations encompassed by the claims appended hereto and the equivalents thereof.

What is claimed is:

1. A composite buffer structure for GaAs semiconductor products on a GaAs substrate comprising:
   a semi-insulating GaAs substrate having a first major surface on a plane oriented up to about 20 degrees towards the (1,1,1)A plane from the (1,0,0) crystalline plane;
   a first layer of epitaxial GaAs directly on said first major surface;
   an AlAs/GaAs superlattice directly on said first layer;
   a second layer of epitaxial GaAs directly on said superlattice;
   a first AlGaAs layer having a first mole fraction of Al directly on said second layer;
   a second AlGaAs layer having a second mole fraction of Al directly on said first AlGaAs layer, said second mole fraction being higher than said first mole fraction;
   a third layer of epitaxial GaAs directly on said second AlGaAs layer.

2. A composite buffer structure for GaAs semiconductor products on a GaAs substrate as claimed in claim 1 wherein:
   said first AlGaAs layer has a compositionally graded molecular structure having a starting AlAs mole fraction adjacent said second layer and an ending AlAs mole fraction, higher than said starting AlAs mole fraction, adjacent said second AlGaAs layer.

3. A composite buffer structure for GaAs semiconductor products on a GaAs substrate as claimed in claim 1 wherein:
said AlAs/GaAs superlattice has at least 5 periods.

4. A composite buffer structure for GaAs semiconductor products on a GaAs substrate as claimed in claim 2 wherein:
said first, second and third layers of GaAs and said first and second AlGaAs layers are intrinsic layers.

5. A composite buffer structure for GaAs semiconductor products on a GaAs substrate as claimed in claim 2 wherein:
said starting AlAs mole fraction is about 0.1 and said ending AlAs mole fraction is between about 0.4 and 0.6.

6. A composite buffer structure for GaAs semiconductor products on a GaAs substrate as claimed in claim 5 wherein:
said second AlGaAs layer is between about 0.5 micrometer and 1.0 micrometer.

7. A semiconductor product including a composite buffer structure on a GaAs substrate comprising:
a semiconductor substrate having a first major surface misoriented up to about 10 degrees towards the (1,1,1) plane from the (1,0,0) plane;
a first epitaxial layer of GaAs over said substrate;
a superlattice of AlAs/GaAs over said first layer of GaAs;
a second epitaxial layer of GaAs over said superlattice;
a first AlGaAs layer over said second layer of GaAs, said first AlGaAs layer having a graded Al concentration and includes a top surface portion having a selected Al mole fraction;
a second AlGaAs layer over said first AlGaAs layer, said second AlGaAs layer having a uniform concentration of Al at said selected mole fraction;
a third layer of eiptaxial GaAs over said second AlGaAs layer.

* * * * *